US012701956B2

(12) United States Patent
Shin

(10) Patent No.: US 12,701,956 B2
(45) Date of Patent: Aug. 4, 2026

(54) WAFER BOAT AND PLATE FOR WAFER BOAT

(71) Applicant: HANWHA SOLUTIONS CORPORATION, Seoul (KR)

(72) Inventor: Kyoungsup Shin, Cheonan-si (KR)

(73) Assignee: Hanwha Solutions Corporation, Seoul (KR)

( * ) Notice: Subject to any disclaimer, the term of this patent is extended or adjusted under 35 U.S.C. 154(b) by 425 days.

(21) Appl. No.: 18/258,420

(22) PCT Filed: Jan. 5, 2022

(86) PCT No.: PCT/KR2022/000124
§ 371 (c)(1),
(2) Date: Jun. 20, 2023

(87) PCT Pub. No.: WO2022/149840
PCT Pub. Date: Jul. 14, 2022

(65) Prior Publication Data
US 2024/0038560 A1 Feb. 1, 2024

(30) Foreign Application Priority Data
Jan. 6, 2021 (KR) ........................ 10-2021-0001533

(51) Int. Cl.
*H01L 21/673* (2006.01)
*C23C 16/458* (2006.01)
*H01J 37/32* (2006.01)
*H10F 71/00* (2025.01)
*H10P 72/10* (2026.01)

(52) U.S. Cl.
CPC .......... *H10P 72/13* (2026.01); *C23C 16/4583* (2013.01); *H01J 37/32715* (2013.01); *H10F 71/00* (2025.01); *H10P 72/17* (2026.01); *H01J 2237/3321* (2013.01)

(58) Field of Classification Search
CPC .... C23C 16/4583; H10P 72/13; H10P 72/135; H10P 72/127; H10P 72/17; H01J 37/32715
See application file for complete search history.

(56) References Cited

U.S. PATENT DOCUMENTS

2018/0066354 A1* 3/2018 Klick ...................... C23C 14/34

FOREIGN PATENT DOCUMENTS

| CN | 211605172 U | 9/2020 |
|---|---|---|
| JP | 2017-512386 A | 5/2017 |
| KR | 10-2012-0023238 A | 3/2012 |
| KR | 10-2013-0095495 A | 8/2013 |
| KR | 10-2019-0025419 A | 3/2019 |
| WO | 2019/045204 A1 | 3/2019 |

OTHER PUBLICATIONS

Extended European Search Report dated Nov. 29, 2024 issued in corresponding European Patent Appln. No. 22736817.2.
International Search Report PCT/ISA/210 for International Application No. PCT/KR2022/000124 on Apr. 14, 2022.

* cited by examiner

*Primary Examiner* — Joseph A Miller, Jr.
(74) *Attorney, Agent, or Firm* — Harness, Dickey & Pierce, P.L.C.

(57) ABSTRACT

A wafer boat according to an aspect of the present invention includes: at least one plate on which a plurality of wafers are loaded; and a plurality of pin pairs that are arranged along a first direction from the at least one plate and respectively support corresponding wafers among the plurality of wafers.

15 Claims, 8 Drawing Sheets

[FIG. 1]
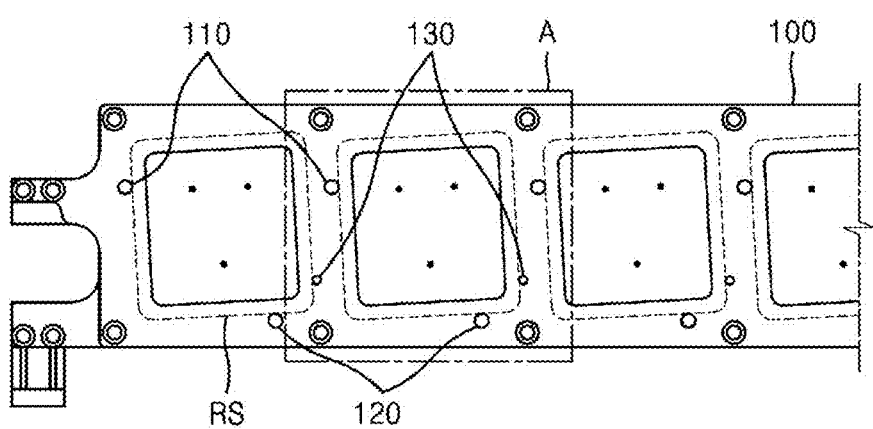
[FIG. 2]
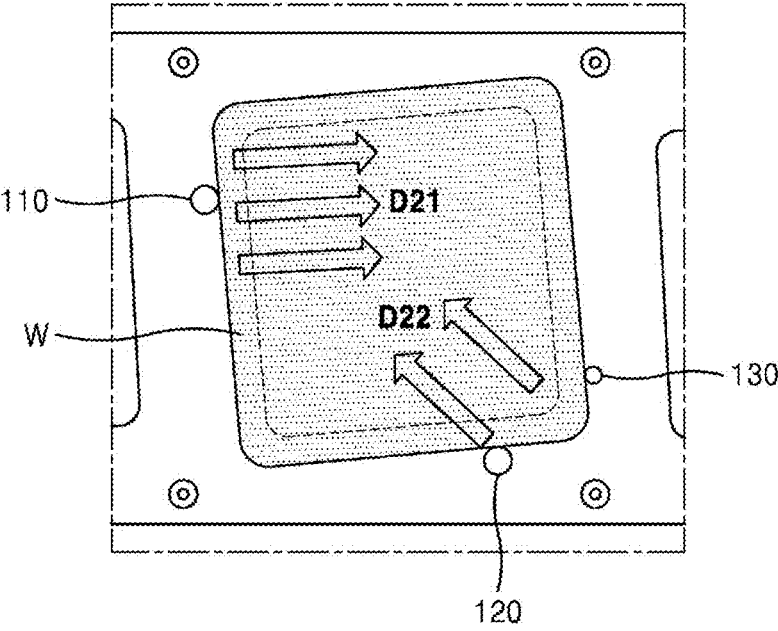

[FIG. 3]
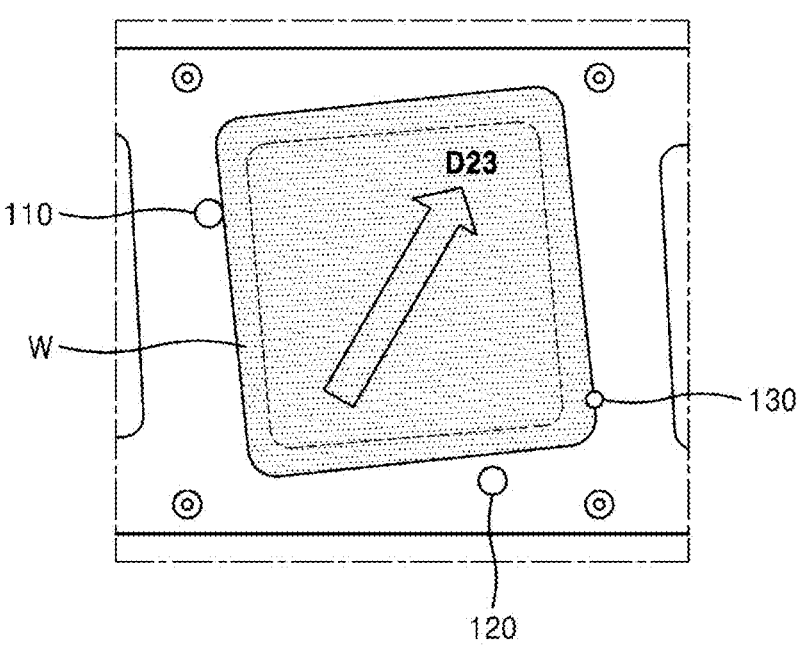
[FIG. 4]
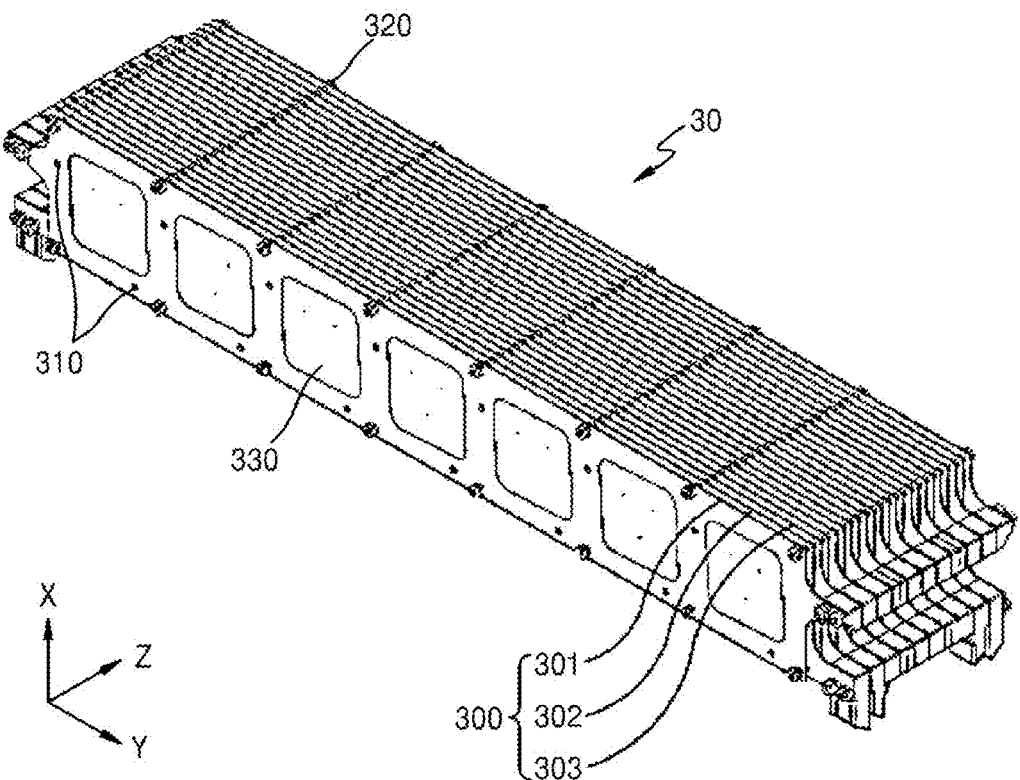

[FIG. 5]
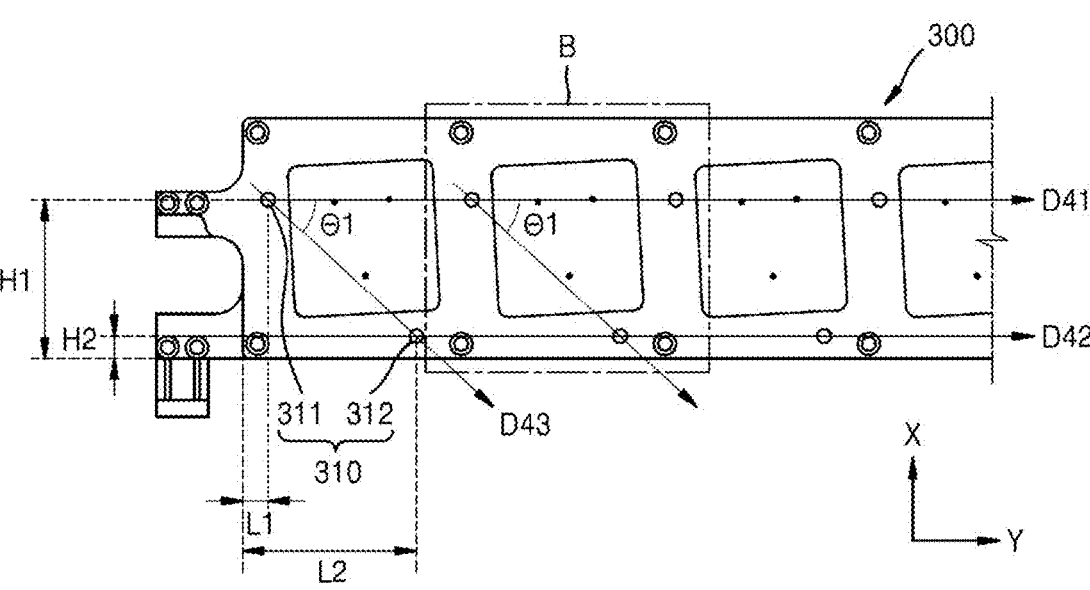
[FIG. 6]
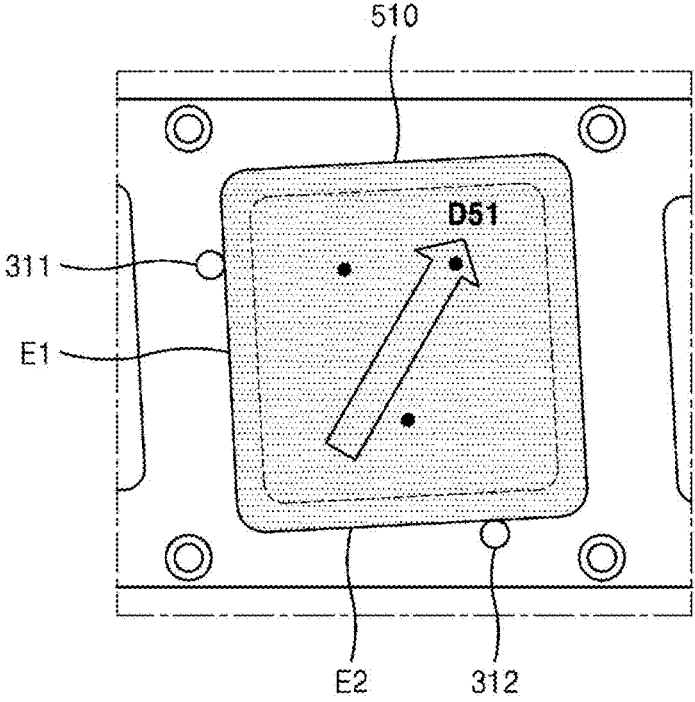

[FIG. 7]
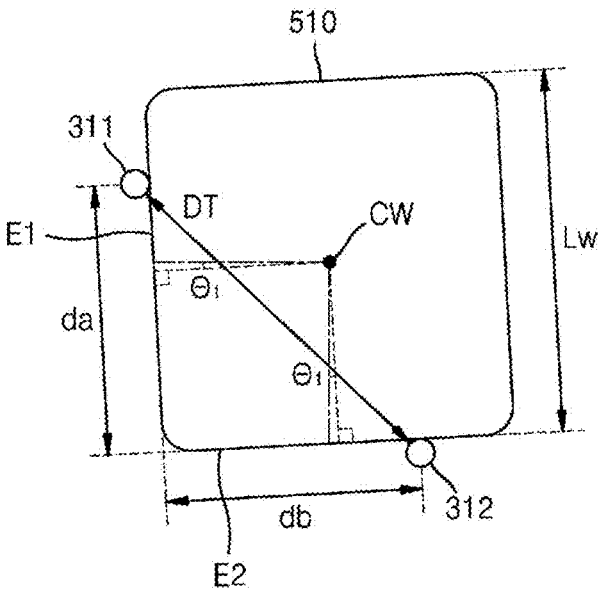
[FIG. 8]
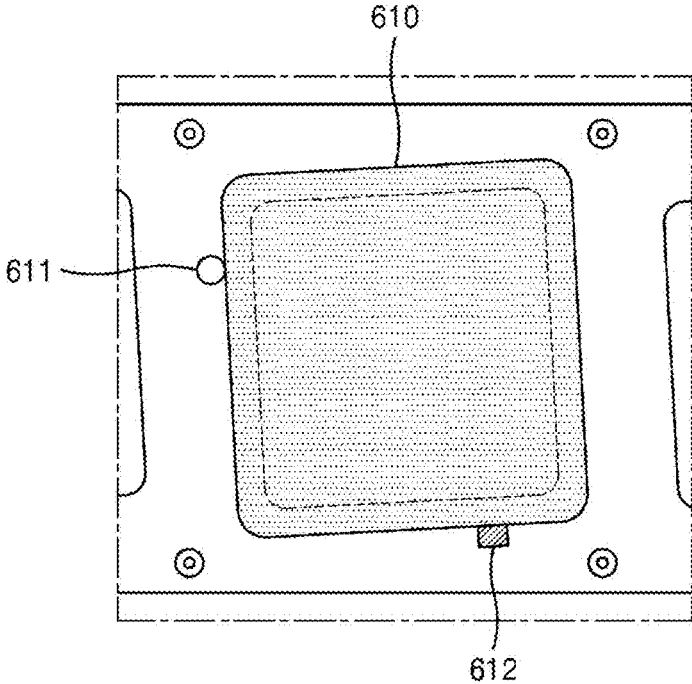

[FIG. 9]
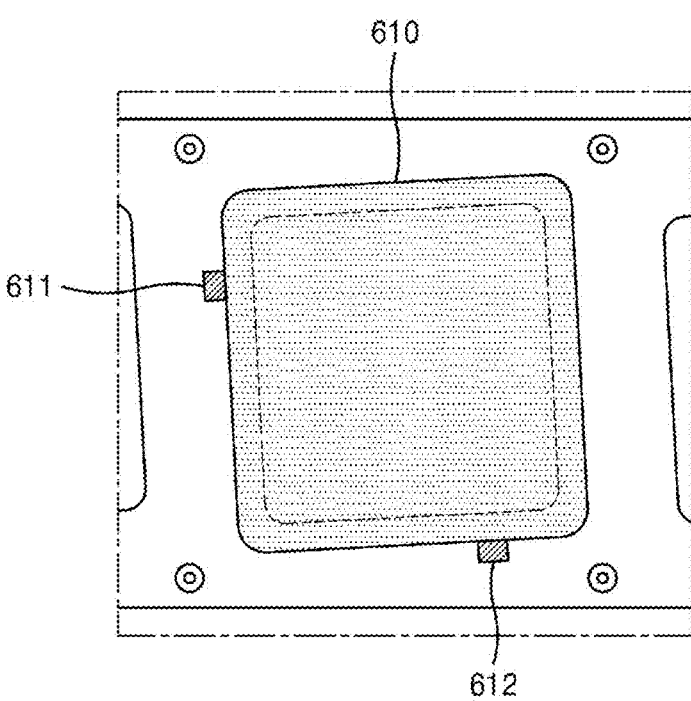
[FIG. 10]
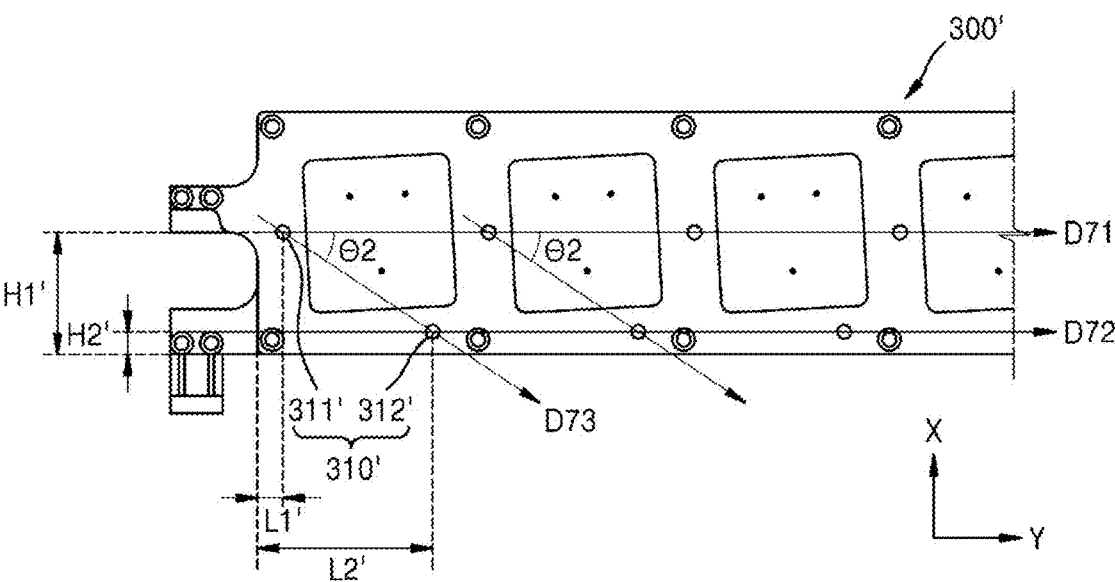

[FIG. 11]

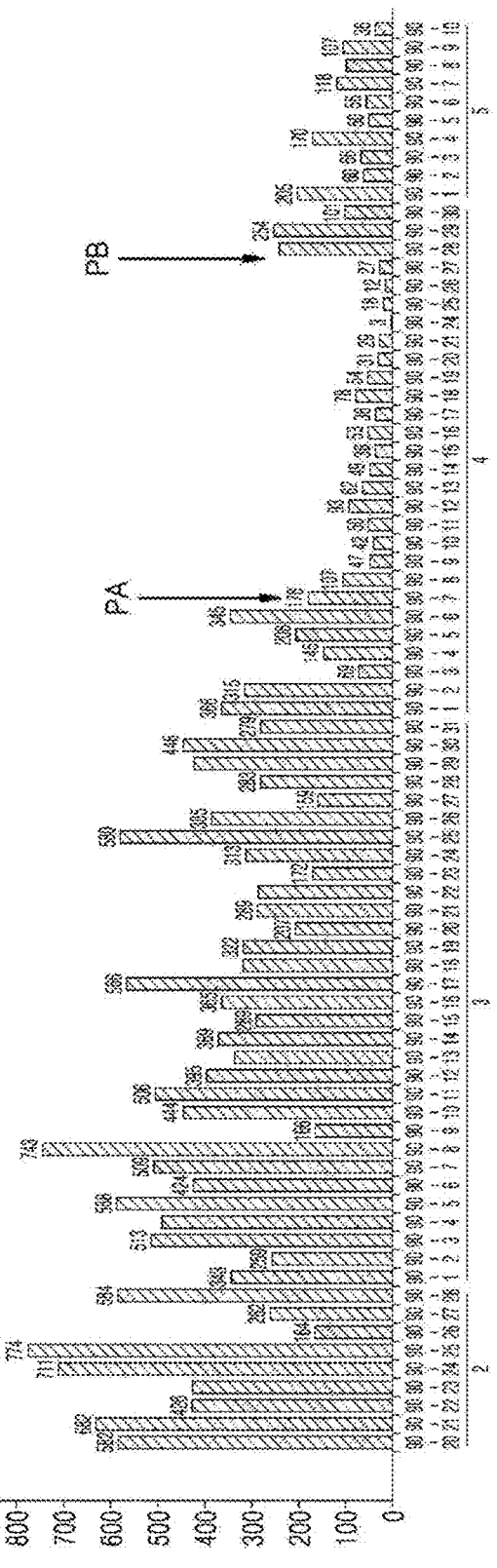
[FIG. 12]

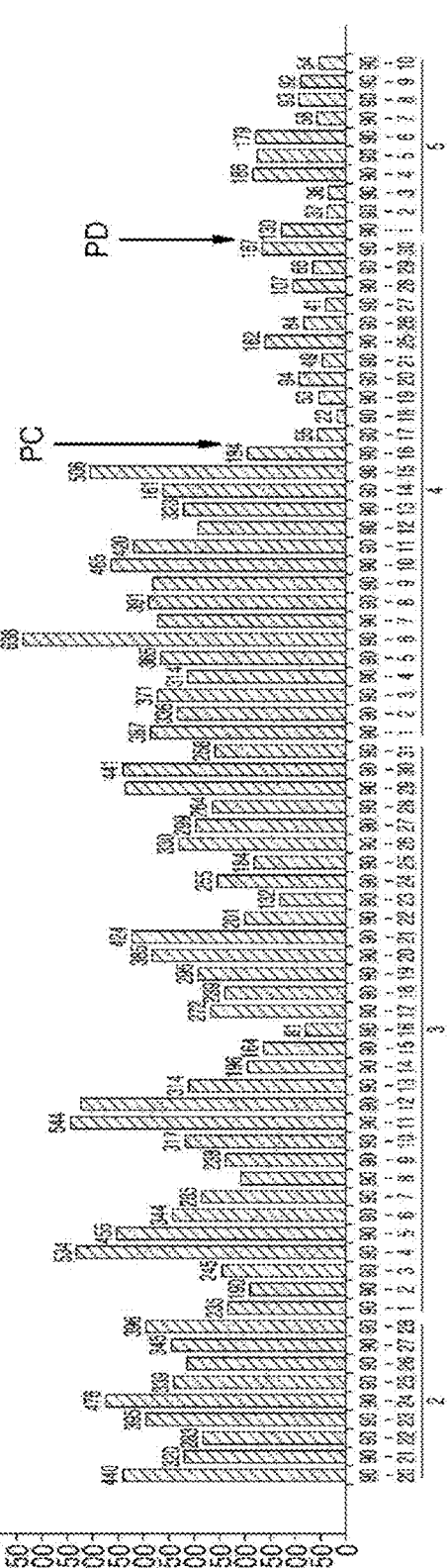
[FIG. 13]

WAFER BOAT AND PLATE FOR WAFER BOAT

CROSS-REFERENCE TO RELATED APPLICATIONS

This application is a national phase under 35 U.S.C. § 371 of PCT International Application No. PCT/KR2022/000124 which has an International filing date of Jan. 5, 2023, which claims priority to KR Application No. 10-2021-0001533, filed Jan. 6, 2021, the entire contents of each of which are hereby incorporated by reference.

TECHNICAL FIELD

The technical idea of the present disclosure relates to a wafer boat and a plate for the wafer boat.

BACKGROUND ART

In the manufacturing of a solar cell, in order to form a predetermined material layer on the surface of a wafer (or substrate), various thin film deposition processes such as reduced pressure chemical vapor deposition (RPCVD), atmosphere pressure chemical vapor deposition (APCVD), plasma enhanced chemical vapor deposition (PECVD), and the like are performed. The process may be performed on a plurality of wafers in a batch. In other words, the plurality of wafers may be put into the chamber at a time, and thin film deposition and the like may be performed on the plurality of wafers at the same time. This is possible because there is a support device called a wafer boat having a space capable of accommodating several wafers.

The wafer boat includes a plurality of plates made of an electrically conductive material such as graphite, and at least three pins for supporting each of the wafers are provided on the plurality of plates. At least three pins are each disposed to contact a different side edge of the wafer, respectively, and the wafer is accommodated and supported between the at least three pins.

Due to the wafer accommodation and support structure of the wafer boat, a wafer bowing phenomenon due to high temperature expansion during the process in the chamber is deepened, and the wafer is caught or detached from a specific pin. In addition, interference due to pins occurs during wafer loading and unloading processes. Since these phenomena cause damage to the wafer as well as process stoppage, a wafer boat having a new structure capable of preventing this phenomenon is required.

DISCLOSURE

Technical Problem

In order to solve the technical problems, the technical idea of the present disclosure is directed to providing a wafer boat and a plate for a wafer boat capable of mitigating a wafer bowing occurring in a solar cell manufacturing process, and thus preventing a breakage of wafer and the wafer from being detached due to a vibration occurring during transfer, while stably supporting and transferring the wafer.

The technical problems to be solved by the technical idea of the present disclosure are not limited to the aforementioned problem(s), and other problems not mentioned will be clearly understood by those skilled in the art from the following description.

Technical Solution

In order to achieve the above objects, according to an aspect of the technical idea of the present disclosure, disclosed is a wafer boat including: at least one plate on which a plurality of wafers are loaded; and a plurality of pin pairs that are arranged along a first direction from the at least one plate and respectively support corresponding wafer among the plurality of wafers.

According to an exemplary embodiment, the first direction may be a direction in which the plurality of wafers are arranged, and a direction of a line connecting pins of any one pin pair of the plurality of pin pairs may form a predetermined angle with the first direction.

According to an exemplary embodiment, the pins of any one pin pair may be respectively located at different levels with respect to one edge of the at least one plate.

According to an exemplary embodiment, the pins of any one pin pair may be located to have a separation distance satisfying the following equation:

$$DT = \sqrt{da^2 + db^2}, \qquad \text{[Equation]}$$
$$\left(Lw\left(\frac{1}{2} + \tan\theta t\right) \le da < Lw, \; Lw\left(\frac{1}{2} - \tan\theta t\right) \le db < Lw\right)$$

where, da may be a distance from a vertex closest to a lower edge of the plate among the vertexes of the corresponding wafer to any one of the pins, db may be a distance from the vertex to the other pin, Lw may be a length of one side of the corresponding wafer, and θt may be an angle of inclination of the corresponding wafer.

According to an exemplary embodiment, the pins of any one pin pair may be respectively in contact with adjacent edges among the edges of the corresponding wafer.

According to an exemplary embodiment, the pins of any one pin pair of the plurality of pin pairs may be respectively in point contact or line contact with the corresponding wafer.

According to an exemplary embodiment, the at least one plate may include a plurality of openings corresponding to the plurality of wafers.

According to an exemplary embodiment, the pins of any one pin pair of the plurality of pin pairs may be disposed parallel to a circumference of a corresponding opening among the plurality of openings.

According to an exemplary embodiment, when the at least one plate is configured in plurality, at least some of the plurality of pin pairs respectively arranged on adjacent plates may do not overlap with each other.

According to another aspect of the technical idea of the present disclosure, disclosed is a plate on which a plurality of wafers are loaded, the plate comprising: a plurality of pin pairs arranged along a direction in which the plurality of wafers are arranged in the plate and each of the plurality of pin pairs supporting a corresponding wafer among the plurality of wafers in a direction different from the direction in which the plurality of wafers are arranged.

According to an exemplary embodiment, a direction of a line connecting pins of any one pin pair of the plurality of pin pairs may form a predetermined angle with the direction in which the plurality of wafers are arranged and may be perpendicular to the different direction.

According to an exemplary embodiment, the pins of any one pin pair may be respectively located at different levels with respect to one edge of the at least one plate.

According to an exemplary embodiment, the pins of any one pin pair may be respectively in contact with adjacent edges among the edges of the corresponding wafer.

According to an exemplary embodiment, each pin of any one pin pair of the plurality of pin pairs may be in point contact or line contact with the corresponding wafer.

According to an exemplary embodiment, the plate may further include a plurality of openings corresponding to the plurality of wafers.

According to an exemplary embodiment, the pins of any one pin pair of the plurality of pin pairs may be disposed parallel to a circumference of a corresponding opening among the plurality of openings.

Advantageous Effects

The wafer boat and the plate of the wafer boat according to the embodiments of the present disclosure include a pair of pins as supporting elements for supporting one wafer.

By supporting the wafer while minimizing contact by the pair of pins, wafer bowing, warpage phenomena, etc. due to thermal expansion of the wafer in a high-temperature solar cell manufacturing process can be mitigated, and thus it is possible to prevent breakage, cracks, and detachment of the wafer as well as interruption of the process.

In addition, interference in the load and unload stage of the wafer can be reduced, and thus a moving line design, control, etc. of a robot for the load and unload of the wafer is easily performed.

The effects of the embodiments according to the technical idea of the present disclosure are not limited to those mentioned above, and other effects not mentioned herein will be clearly understood by those of ordinary skill in the art from the following description.

DESCRIPTION OF DRAWINGS

A description of each drawing is provided to provide a more thorough understanding of the drawings cited in the present disclosure.

FIG. 1 is a diagram schematically illustrating a plate of a wafer boat according to a related art.

FIGS. 2 and 3 are partial enlarged views of the plate of FIG. 1.

FIG. 4 is a perspective view schematically illustrating a wafer boat according to an exemplary embodiment of the present disclosure.

FIG. 5 is a diagram schematically illustrating an example of a plate of the wafer boat of FIG. 4.

FIGS. 6 and 7 are partial enlarged views of the plate of FIG. 5.

FIGS. 8 and 9 are diagrams for describing a modified embodiment of pin pairs.

FIG. 10 is a diagram schematically illustrating another example of a plate of the wafer boat of FIG. 4.

FIG. 11 is an exploded view illustrating some plates adjacent to each other in the wafer boat of FIG. 4.

FIGS. 12 and 13 are graphs of robot alarm results when using a wafer boat according to an exemplary embodiment of the present disclosure.

MODE FOR INVENTION

Exemplary embodiments according to the technical idea of the present disclosure are provided to more fully describe the technical idea of the present disclosure to those skilled in the art, and the following embodiments may be modified in various other forms, and the scope of the technical idea of the present disclosure is not limited to the following embodiments. Rather, these embodiments make the present disclosure more meaningful and complete and are provided for fully conveying the technical idea of the present invention to those of ordinary skill in the art.

Although the terms "first," "second," etc. are used in this specification to describe various members, regions, layers, portions, and/or components, it is apparent that these members, regions, layers, portions, and/or components should not be limited by these terms. These terms do not imply any particular order, top, bottom, or superiority and are used only to distinguish one member, region, portion, or component from another member, region, portion, or component. Thus, the first member, the first region, the first portion, or the first component to be described below may refer to the second member, the second region, the second portion, or the second component without departing from the teachings of the technical idea of the present disclosure. For example, the first component may be named as the second component and similarly, the second component may be named as the first component, without departing from the scope of the present disclosure.

Unless otherwise defined, all terms used herein have the same meaning as commonly understood by those skilled in the art to which the concept of the present disclosure belongs, including technical and scientific terms. Further, terms such as commonly used and defined in a dictionary should be interpreted as having a meaning consistent with their meaning in the context of the relevant art, and should not be interpreted in an excessively formal meaning unless expressly so defined herein.

When an embodiment is otherwise implementable, a specific process order may be performed differently from the order described. For example, two processes described in succession may be performed substantially simultaneously, or may be performed in an order reverse to the order described.

In the accompanying drawings, for example, variations in the illustrated shape may be expected depending on manufacturing techniques and/or tolerances. Accordingly, the embodiments according to the technical idea of the present disclosure should not be construed as being limited to any particular shape of the regions illustrated in the present disclosure and should include, for example, variations in shape resulting from manufacturing processes. The same reference numerals are used for the same components in the drawings, and redundant descriptions thereof are omitted.

The term "and/or" used herein includes each and all combinations of one or more of the mentioned members.

Hereinafter, embodiments according to the technical idea of the present disclosure will be described in detail with reference to the accompanying drawings.

FIG. 1 is a diagram schematically illustrating a plate of a wafer boat according to a related art, and FIGS. 2 and 3 are partial enlarged views of a portion A of the plate of FIG. 1. In FIGS. 2 and 3, for convenience of description, a state in which a wafer is seated on a plate is assumed and illustrated.

In a process for depositing a predetermined thin film, for example, Si3N4, SiNx, a-Si, Al2O3, AlOx, etc., on a plurality of wafers simultaneously during solar cell manufacturing, a wafer boat having a space capable of accommodating several wafers is used.

As shown in FIG. 1, a plate 100 of a typical wafer boat includes at least three pins 110, 120, and 130 defining a space RS in which a wafer can be seated on one surface thereof. These three pins 110, 120, and 130 contact different side edges (outside) of the wafer to support the wafer, and the wafers loaded on the three pins 110, 120, and 130 may be unloaded from the wafer boat after going through the thin film deposition process described above.

The three pins 110, 120, and 130 disposed on the plate 100 support the wafer by forming three support points at the vertexes of an imaginary triangle connecting each pin. In other words, the three pins 110, 120, and 130 support the wafer by a triangular support structure.

Referring to FIGS. 2 and 3, an example in which the wafer is supported by any pin group including three pins in the plate 100 illustrated in FIG. 1 will be described in more detail.

First, referring to FIG. 2, a wafer W may be mounted on the plate 100 by a pin group including three pins 110, 120, and 130.

When the wafer W is mounted on the plate 100 by the pins 110, 120, and 130 as shown in FIG. 2, the wafer W is fixed by a virtual triangular shape connecting the pins 110, 120, and 130. Specifically, the wafer W is supported in one direction D21 by the pin 110 and the pin 120, and is supported in another direction D22 by the pin 110 and the pin 130. Accordingly, the wafer W is mounted on the plate 100 while its load is distributed and supported in two directions different from each other by the three pins 110, 120, and 130.

However, when the wafer is supported as described above, the phenomenon that the wafer W bends or distorts during high-temperature processing in the above-described thin film deposition process is exacerbated. The wafer W thermally expands in various directions and the deformation is exacerbated. Further, such deformation causes various problems such as a breakage of the wafer W, a process error/interruption, and a degradation of the thin film.

Referring to FIG. 3, as the degree of deformation of the wafer W increases, the wafer W is tilted toward the pin 130 away from the fixed position (i.e., moved in the direction of D23), and the wafer W is caught in the pin 130.

As a result, a partial breakage of the wafer W occurs, and the wafer W is easily separated even from fine vibration generated during the movement of the plate 100, causing a problem in that the process being performed is stopped.

In addition, a thickness uniformity of a thin film decreases during a thin film deposition process, and thus a quality of the thin film decreases, and an arcing occurs due to an electric current for plasma formation concentrated on the pin 130 in a thin film deposition process such as plasma enhanced chemical vapor deposition (PECVD).

In addition, when a wafer is loaded or unloaded, a limitation is applied to a movement path, a direction, or the like of the wafer due to three pins, or a limitation of a robot operation for loading or unloading occurs.

The present disclosure provides a plate for a wafer boat and a wafer boat including the same, which can solve the above-described problems associated with the plate 100 in the related art, and the technical idea of the present disclosure will be described in more detail with reference to the following drawings.

FIG. 4 is a perspective view schematically illustrating a wafer boat according to an exemplary embodiment of the present disclosure.

Referring to FIG. 4, a wafer boat 30 according to an embodiment of the present disclosure includes a plurality of plates 300 into which a plurality of wafers are attached and detached, and a plurality of pin pairs 310 arranged in parallel to one surface of each of the plurality of plates 300 in one direction and supporting a corresponding wafer among the plurality of wafers, respectively. And, the wafer boat 30 further includes clamping parts 320.

The plurality of plates 300 may include an electrically conductive material. For example, the plurality of plates 300 may include graphite. However, the present disclosure is not limited thereto. For example, the plurality of plates 300 may have a structure in which a predetermined electrically conductive material is coated on a plate base material.

The plurality of plates 300 may be stacked in a state in which they are spaced apart from each other at a predetermined distance in the Z direction by the clamping parts 320 and the connection block. As described above, the plurality of plates 300 may be stacked in a state in which they are arranged substantially parallel to the Z direction, and in this case, the number of stacking of the plurality of plates 300 may vary variously depending on a process or a work environment.

The plurality of pin pairs 310 may define spaces in which wafers are accommodated on one surface of each of the plurality of plates 300, that is, spaces in which wafers are mounted. Each of the plurality of pin pairs 310 may include two pins and support a corresponding wafer in one direction.

The plurality of pin pairs 310 may be arranged in one direction (e.g., a longitudinal direction (Y direction)) in which wafers are mounted and arranged in the plurality of plates 300.

Meanwhile, FIG. 4 illustrates an embodiment in which seven pin pairs 310 are disposed so that seven wafers can be attached to and detached from one plate, but this is only an example, and the number of wafers that can be attached to and detached from one plate and the corresponding number of pin pairs is not limited thereto. In other words, the number of wafers that can be attached to and detached from one plate and the number of pin pairs may be selected or changed according to a process or a work environment.

The plurality of pin pairs 310 will be described in more detail below with reference to FIGS. 5 to 10.

According to an embodiment, the plurality of plates 300 may further include a plurality of openings 330 that are partially open, corresponding to a space in which the wafers are mounted. A portion of the wafer may be exposed through the plurality of openings 330, and the exposed surface may be processed by facing plasma or one or more gases.

Meanwhile, when the plurality of plates 300 include the plurality of openings 330, each pins of the plurality of pin pairs 310 may be disposed to be spaced apart from a circumference of a corresponding opening among the plurality of openings 330 at a predetermined interval.

The wafer boat 30 may be moved inside or outside the chamber of the equipment for performing a thin film deposition process or the like while one or more wafers are loaded onto each of the plurality of plates 300.

The wafer boat 30 may be transported into the chamber through the chamber entrance after sequentially loading wafers onto the plurality of plates 300 from the outside, and the plurality of wafers may be simultaneously processed by a batch process. After the process is completed, the wafer boat 30 may be drawn out through the chamber entrance, and the wafers that have been subjected to the process in the chamber may be sequentially unloaded from the plurality of plates 300.

FIG. 5 is a diagram schematically illustrating an example of a plate of the wafer boat of FIG. 4, FIGS. 6 and 7 are partial enlarged views of a portion B of the plate of FIG. 5, and FIGS. 8 and 9 are diagrams for describing a modified embodiment of pin pairs. For convenience of explanation, FIG. 6, FIG. 7, FIG. 8, and FIG. 9 are shown assuming that the corresponding wafer is seated on the plate 300.

First, referring to FIG. 5, the plate 300 includes a plurality of pin pairs 310 arranged along one direction on one surface and supporting the wafers, respectively.

The plurality of pin pairs 310 may include a first pin 311 and a second pin 312, respectively. The first pins 311 of the plurality of pin pairs 310 may be arranged in parallel along a direction D41, and the second pins 312 may also be arranged in parallel along a direction D42. Here, the directions D41 and D42 may be substantially parallel to the longitudinal direction (Y direction) of the plate 300.

The first pin 311 and the second pin 312 of each of the plurality of pin pairs 310 may be positioned at different levels along the height direction (X direction) of the plate 300 with respect to a lower edge of the plate 300. For example, the second pin 312 of the frontmost pin pair among the plurality of pin pairs 310 may be positioned at a position H2 lower than a position H1 of the first pin 311.

And the first pin 311 and the second pin 312 of each of the plurality of pin pairs 310 may be positioned at different levels along the longitudinal direction (Y direction) of the plate 300 with respect to one edge of the plate 300. For example, the second pin 312 of the frontmost pin pair among the plurality of pin pairs 310 may be positioned at a position L2 farther than a position L1 of the first pin 311.

According to this arrangement structure, a direction D43 of a virtual line connecting the first pin 311 and the second pin 312 of the plurality of pin pairs 310 may form a predetermined first angle θ1 with the direction D41 or D42. Here, the predetermined first angle θ1 may be greater than 0 degrees and less than 90 degrees.

The plurality of pin pairs 310 may support the wafers, respectively. More specifically, The first and second pins 311 and 312 of the plurality of pin pairs 310 may maintain the position of the corresponding wafer by distributing and supporting the load of the corresponding wafer while in contact with the edges of the corresponding wafer.

The first and second pins 311 and 312 may be formed to penetrate the plate 300 and have at least one end protruding from the surface of the plate 300. And the protruded portion (hereinafter, referred to as a protruding portion) may have a circular cross-section and may come into dot contact with the edge of the corresponding wafer. However, the present disclosure is not limited thereto, and according to an embodiment, the protruding portion may have a polygonal cross-section and may come into line contact or surface contact with the edge of the corresponding wafer (see FIGS. 8 and 9).

According to an embodiment, the protruding portions of the first and second pins 311 and 312 may have side surfaces that are inclined downward from the top surface of the protruded portion toward the surface of the plate 300 (i.e., the through portion). However, the present disclosure is not limited thereto. For example, the protruding portions of the first and second pins 311 and 312 may have portions, stepped portions, grooves, or the like that are inclined downward on a portion of the side surfaces corresponding to only the portions in contact with the corresponding wafer edge.

Meanwhile, the first and second pins 311 and 312 may be pins having at least one of shapes, sizes, and materials that are the same as each other, but the present disclosure is not limited thereto (see FIGS. 8 and 9).

Further referring to FIG. 6, the first and second pins 311 and 312 may be in contact with edges adjacent to each other among edges of the wafer 510 to be supported, respectively, and support the wafer in one direction.

For example, the first and second pins 311 and 312 may be in contact with a first edge E1 and a second edge E2 adjacent to each other of the wafer 510, respectively. Accordingly, the wafer 510 may be supported in a direction D51 that forms a predetermined angle with a virtual line connecting the first and second pins 311 and 312. According to an embodiment, the direction D51 may be perpendicular to the virtual line.

Further referring to FIG. 7, the first and second pins 311 and 312 may be disposed to have a separation distance DT between them that satisfies [Equation 1] below.

$$DT = \sqrt{da^2 + db^2},$$ 
$$\left( Lw\left(\frac{1}{2} + \tan\theta t\right) \leq da < Lw,\ Lw\left(\frac{1}{2} - \tan\theta t\right) \leq db < Lw \right)$$

[Equation 1]

where, da denotes a distance from a vertex closest to a lower edge of the plate 300 among the vertexes of the wafer 510 to the first pin 311, db denotes a distance from the vertex to the second pin 312, Lw denotes a length of one side of the wafer 510, and θt denotes an angle of inclination of the wafer 510.

As the wafer 510 is supported in only one direction in an inclined state by the first and second pins 311 and 312, the wafer 510 may be separated while being rotated toward the first edge E1 or the second edge E2 due to an impact generated during transfer. To prevent this, the first and second pins 311 and 312 may be disposed at positions where they may balance even in an unbalanced state, as illustrated in FIG. 7, etc. from positions where the center of gravity CW of the wafer 510 may be maintained while maintaining the separation distance satisfying Equation 1 between the first and second pins 311 and 312.

However, the technical idea of the present disclosure is not limited thereto. For example, in Equation 1, the range of values that each of da and db can have is limited, but the range of values that da or db can have is not limited or may vary according to embodiments.

As described above, as the two pins, that is, a pair of pins, support the wafer in one direction while minimizing contact with the wafer to be supported, warpage and bending phenomena of the wafer may be mitigated when a high-temperature process for forming a thin film on the wafer is performed. Accordingly, it is possible to prevent partial breakage and detachment of the wafer and prevent various problems such as a degradation in quality of the thin film.

In addition, by implementing a structure for holding and supporting wafers through pin pairs each including two pins, the overall number of pins protruding from the surface of the plate is reduced and the complexity of the arrangement structure is reduced, and thus, a moving line design of a robot for loading and unloading the wafer or a control thereof may be facilitated. Moreover, as the total number of pins is reduced compared to conventional plates, there is an effect of reducing cost.

A modified embodiment of the pin pair will be described with reference to FIGS. 8 and 9.

In the case of the pin pairs 310 described with reference to FIGS. 4 to 7, the pins may make point contact with the edge of the corresponding wafer, each in the same way.

However, the technical idea of the present disclosure is not limited thereto, and the pins constituting the pin pair may make different contact structures when in contact with the edges of the corresponding wafer, and in this case, a contact structure other than point contact may be formed.

Referring to FIG. 8, the first pin 611 of the pin pair 310 may have a protruding portion having a circular cross-section and make point contact with the edge of the corresponding wafer 610, and the second pin 612 of the pin pair 310 may have a protruding portion having a polygonal (e.g., quadrangular) cross-section and make line contact with the edge of the corresponding wafer 610.

Referring to FIG. 9, both the first pin 611 and the second pin 612 of the pin pair 310 may have a protruding portion having a polygonal (e.g., quadrangular) cross-section and may make line contact with edges of the corresponding wafer 610, respectively.

In comparison with a conventional structure of supporting a wafer with three or more pins, in consideration of increasing a load dispersed in each pin due to a decrease in the number of pins (i.e., in consideration of increasing a supporting capability required for each pin), in addition to an implementation method of stably supporting a wafer through adjustment of a separation distance, an arrangement position, and the like between pins constituting a pin pair, in which a wafer is stably supported (see FIG. 10), a contact point of at least one pin among pins constituting a pin pair is increased to more stably support the wafer.

Meanwhile, although not shown in FIGS. 8 and 9, of course, a pin pair may be implemented such that at least one pin among pins constituting the pin pair is in surface contact with an edge of a corresponding wafer.

FIG. 10 is a diagram schematically illustrating another example of a plate of the wafer boat of FIG. 4. The plate 300' is different from the plate 300 described with reference to FIG. 5 in the arrangement structure of the pins constituting the pin pair. In the description of the plate 300' with reference to FIG. 10, since the same or corresponding member numbers as those in FIG. 5 indicate the same or corresponding members, redundant descriptions are omitted for convenience of description and differences will be mainly described.

Referring to FIG. 10, the plate 300' includes a plurality of pin pairs 310' arranged along one direction on one surface and supporting the wafers, respectively.

The plurality of pin pairs 310' may include a first pin 311' and a second pin 312', respectively. The first pins 311' of the plurality of pin pairs 310' may be arranged in parallel along a direction D71, and the second pins 312' may also be arranged in parallel along a direction D72. Here, the directions D71 and D72 may be substantially parallel to the longitudinal direction (Y direction) of the plate 300'.

The first pin 311' and the second pin 312' of each of the plurality of pin pairs 310' may be positioned at different levels along the height direction (X direction) of the plate 300' with respect to a lower edge of the plate 300'. For example, the second pin 312' of the frontmost pin pair among the plurality of pin pairs 310' may be positioned at a position H2' lower than a position H1' of the first pin 311'.

And the first pin 311' and the second pin 312' of each of the plurality of pin pairs 310' may be positioned at different levels along the longitudinal direction (Y direction) of the plate 300' with respect to one edge of the plate 300'. For example, the second pin 312' of the frontmost pin pair among the plurality of pin pairs 310' may be positioned at a position L2' farther than a position L1' of the first pin 311'.

According to this arrangement structure, a direction D73 of a virtual line connecting the first pin 311' and the second pin 312' of the plurality of pin pairs 310' may form a predetermined second angle θ2 with the direction D71 or D72. Here, the predetermined second angle θ2 may be greater than 0 degrees and less than 90 degrees.

In comparison with the pin pairs 310 of the plate 300 described with reference to FIG. 5, the pin pairs 310' of the plate 300' may be adjusted to have a lower position of the first pins 311' in the X direction and may be positioned to have a farther position of the second pins 312' in the Y direction. In addition, the angle formed by the direction D73 of the virtual line connecting the first pins 311' and the second pins 312' of the pin pairs 310' on the plate 300' and the direction D71 or D72 which is the direction in which the wafers are arranged may be smaller.

As described above, the plates 300 and 300' of the wafer boat 30 may more easily modify the arrangement position and arrangement structure of the pins compared to the plates 100 described with reference to FIG. 1. Unlike the triangular support structure, the design degree of freedom is greatly increased by applying the line support structure, which is particularly advantageous in that it is possible to more effectively prevent problems that may occur during the plasma-based thin film deposition process as described below.

Figure 11:
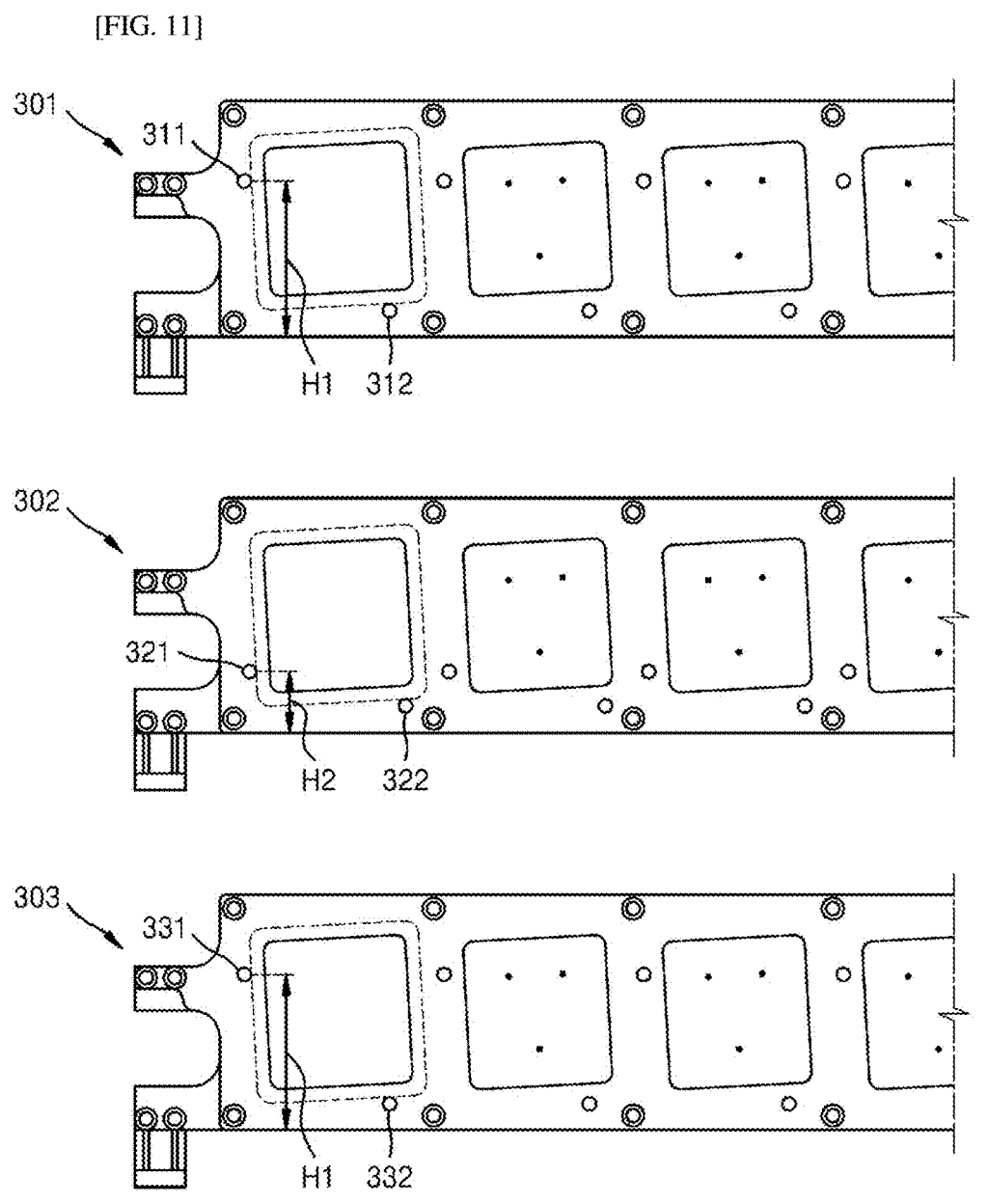

FIG. 11 is an exploded view illustrating some plates adjacent to each other in the wafer boat of FIG. 4. FIG. 11 schematically illustrates three plates 301, 302, and 303 of a plurality of plates 300, assuming that the plates 301 and 303 have substantially the same configuration as the plate 300 shown in FIG. 5 and the plate 302 has substantially the same configuration as the plate 300' shown in FIG. 10.

When the wafer boat is used in the plasma treatment-based thin film deposition process, the plurality of plates of the wafer boat may become electrodes themselves or electrodes may be installed at a level lower than the pins. In this case, the pins supporting the wafer may protrude more than the plate or electrodes, and when the plates having the same pin arrangement structure are sequentially stacked, a distance between pins of corresponding positions between adjacent plates becomes relatively closer than a distance between electrodes.

For this reason, as plasma is concentrated on the pins when plasma is generated, deterioration in thickness uniformity and quality deterioration of the thin film may be caused. In addition, since the electric current for plasma formation is concentrated on the pins corresponding to the support structure of the wafer, it is a cause of arcing.

The wafer boat 30 according to an embodiment of the present disclosure may have a structure in which the pins do not overlap between the adjacent plates 301 and 302 or 302 and 303 during the stacking of the plurality of plates 300.

More specifically, the first pins 311 and 321 of the corresponding pair of pins in the plates 301 and 302 adjacent to each other may have different positions positioned from the lower edge of the plate in the height direction, and the first pins 321 and 331 of the corresponding pair of pins in the plates 302 and 303 adjacent to each other may also have different positions positioned from the lower edge of the plate in the height direction.

Similarly, the second pins 312 and 322 of the corresponding pair of pins in the plates 301 and 302 adjacent to each other may have different positions positioned from one edge of the plate in the longitudinal direction, and the second pins 322 and 332 of the corresponding pair of pins in the plates 302 and 303 adjacent to each other may also have different positions positioned from one edge of the plate in the longitudinal direction.

As described above, the plates may be disposed to be alternately along a direction in which the plates are stacked so that corresponding pin pairs between adjacent plates do not overlap each other, and thus plasma concentration phenomenon and arcing may be suppressed.

FIGS. 12 and 13 are graphs of robot alarm results when using a wafer boat according to an exemplary embodiment of the present disclosure. Specifically, the graphs of FIGS. 12 and 13 show robot alarm results by wafer warpage and bending phenomena, or the like, and the higher the numerical value, the more alarms by the robot are.

FIG. 12 shows robot alarm results when a wafer boat according to embodiments of the present disclosure is used from a PA point. It can be seen that the number of robot alarms from the PA point where the wafer boat according to the embodiments of the present disclosure starts to be used is significantly lower than the number of robot alarms from the past using the existing wafer boat. At a PB point, the number of robot alarms increased again due to boat alignment issues, but it can be seen that compared to using conventional wafer boats, the number of robot alarms decreased by more than 50% when using a wafer boat according to the embodiments of the present disclosure.

Similarly, FIG. 13 shows robot alarm results when a wafer boat according to embodiments of the present disclosure is used from a PC point. As in FIG. 12, in FIG. 13, at a PD point, the number of robot alarms increased again due to boat alignment issues, but it can be seen that compared to using conventional wafer boats, the number of robot alarms decreased by more than 50% when using a wafer boat according to the embodiments of the present disclosure.

The wafer boat described above includes a pair of pins for supporting one wafer on a plate, respectively, and supports the wafer in one direction through the pair of pins.

Accordingly, when a wafer is loaded onto a plate, the wafer can be stably loaded without interference with the operation of the robot. In addition, by supporting the wafer in one direction through a pin pair including two pins in a thin film deposition process or the like, a wafer bowing phenomenon caused by thermal expansion of the wafer is mitigated, and thus a thin film quality can be improved, and it is possible to prevent a wafer partial breakage as well as wafer detachment due to vibration generated during movement in a high-temperature wafer state immediately after the corresponding process. In addition, even when the wafer is unloaded from the plate after the process, motion interference of the robot can be reduced, and thus stable manufacturing can be supported.

The above-described description of the embodiments is merely illustrated by reference to the accompanying drawings for understanding the technical idea of the present disclosure, and thus should not be construed as a meaning limiting the technical idea of the present disclosure.

Further, it will be apparent to those skilled in the art that various changes and modifications can be made without departing from the basic principles of the present disclosure.

The invention claimed is:

1. A wafer boat, comprising:
   at least one plate on which a plurality of wafers are loaded; and
   a plurality of pin pairs arranged in the at least one plate along a first direction and each of the plurality of pin pairs supporting a corresponding wafer among the plurality of wafers, wherein
   pins of any one pin pair of the plurality of pin pairs are located to have a separation distance (DT) satisfying the following equation:

$$DT = \sqrt{da^2 + db^2}, \left( Lw\left(\frac{1}{2} + \tan\theta t\right) \le da < Lw, \; Lw\left(\frac{1}{2} - \tan\theta t\right) \le db < Lw \right),$$

where, da is a distance from a vertex closest to a lower edge of the plate among the vertexes of the corresponding wafer to any one of the pins, db is a distance from the vertex to the other pin, Lw is a length of one side of the corresponding wafer, and Ot is an angle of inclination of the corresponding wafer.

2. The wafer boat of claim 1, wherein the first direction is a direction in which the plurality of wafers are arranged, and a direction of a line connecting pins of any one pin pair of the plurality of pin pairs forms a predetermined angle with the first direction.

3. The wafer boat of claim 2, wherein the pins of any one pin pair are respectively located at different levels with respect to one edge of the at least one plate.

4. The wafer boat of claim 2, wherein the pins of any one pin pair are respectively in contact with adjacent edges among a plurality of edges of the corresponding wafer.

5. The wafer boat of claim 1, wherein the pins of any one pin pair of the plurality of pin pairs are respectively in point contact or line contact with the corresponding wafer.

6. The wafer boat of claim 1, wherein the at least one plate comprises a plurality of openings configured to receive the corresponding wafer of the plurality of wafers.

7. The wafer boat of claim 6, wherein the pins of any one pin pair of the plurality of pin pairs are disposed parallel to a circumference of a corresponding opening among the plurality of openings.

8. The wafer boat of claim 1, wherein when the at least one plate is configured in a plurality, at least some of the plurality of pin pairs respectively arranged on adjacent plates do not overlap with each other.

9. A plate on which a plurality of wafers are loaded, the plate comprising:
   a plurality of pin pairs arranged along a direction in which the plurality of wafers are arranged in the plate and each of the plurality of pin pairs supporting a corresponding wafer among the plurality of wafers in a direction different from the direction in which the plurality of wafers are arranged, wherein
   pins of any one pin pair of the plurality of pin pairs are located to have a separation distance (DT) satisfying the following equation:

$$DT = \sqrt{da^2 + db^2} \cdot \qquad \text{[Equation]}$$

$$\left( Lw\left(\frac{1}{2} + \tan\theta t\right) \le da < Lw, \; Lw\left(\frac{1}{2} + \tan\theta t\right) \le db < Lw \right),$$

where, da is a distance from a vertex closest to a lower edge of the plate among the vertexes of the corresponding wafer to any one of the pins, db is a distance from the vertex to the other pin, Lw is a length of one side of the corresponding wafer, and Ot is an angle of inclination of the corresponding wafer.

10. The plate of claim 9, wherein a direction of a line connecting pins of any one pin pair of the plurality of pin pairs forms a predetermined angle with the direction in which the plurality of wafers are arranged and is perpendicular to the different direction.

11. The plate of claim 10, wherein the pins of any one pin pair are respectively located at different levels with respect to one edge of the plate.

12. The plate of claim 10, wherein the pins of any one pin pair are respectively in contact with adjacent edges among the edges of the corresponding wafer.

13. The plate of claim 9, wherein each pin of any one pin pair of the plurality of pin pairs is in point contact or line contact with the corresponding wafer.

14. The plate of claim 9, further comprising:

a plurality of openings corresponding to the plurality of wafers.

15. The plate of claim 14, wherein the pins of any one pin pair of the plurality of pin pairs are disposed parallel to a circumference of a corresponding opening among the plurality of openings.

\* \* \* \* \*